(12) United States Patent
Ishihara

(10) Patent No.: US 6,177,839 B1
(45) Date of Patent: Jan. 23, 2001

(54) VARIABLE GAIN AMPLIFIER CIRCUIT

(75) Inventor: Hisaya Ishihara, Kanagawa (JP)

(73) Assignee: NEC Corporation, Tokyo (JP)

( * ) Notice: Under 35 U.S.C. 154(b), the term of this patent shall be extended for 0 days.

(21) Appl. No.: 09/253,828

(22) Filed: Feb. 19, 1999

(30) Foreign Application Priority Data

Feb. 20, 1998 (JP) .................................................. 10-039174

(51) Int. Cl.$^7$ .................................................. H03F 3/45
(52) U.S. Cl. ........................................ 330/254; 327/359
(58) Field of Search .................. 330/254, 252; 327/359

(56) References Cited

U.S. PATENT DOCUMENTS

| 5,867,778 | * | 2/1999 | Khoury et al. .................. 330/254 |

FOREIGN PATENT DOCUMENTS

| 0099810 | * | 6/1982 | (JP) | ....................... 330/254 |
| 58-200612 | | 11/1983 | (JP) . | |
| 0200612 | * | 11/1983 | (JP) | ....................... 330/254 |
| 0033006 | * | 2/1986 | (JP) | ....................... 330/254 |
| 0157015 | * | 7/1986 | (JP) | ....................... 330/254 |
| 0071311 | * | 4/1987 | (JP) | ....................... 330/254 |
| 62-183207 | | 8/1987 | (JP) . | |
| 0004108 | * | 1/1989 | (JP) | ....................... 330/254 |
| 0106608 | * | 4/1989 | (JP) | ....................... 330/254 |
| 0126816 | * | 5/1989 | (JP) | ....................... 330/254 |
| 0046407 | * | 2/1991 | (JP) | ....................... 330/254 |
| 3-153113 | | 7/1991 | (JP) . | |
| 0153113 | * | 7/1991 | (JP) | ....................... 330/254 |
| 0214912 | * | 9/1991 | (JP) | ....................... 330/254 |
| 405218767 | * | 8/1993 | (JP) | ....................... 330/254 |
| 5-259768 | | 10/1993 | (JP) . | |
| 405259768 | * | 10/1993 | (JP) | ....................... 330/254 |
| 10-41750 | | 2/1998 | (JP) . | |

* cited by examiner

Primary Examiner—Robert Pascal
Assistant Examiner—Khanh Van Nguyen
(74) Attorney, Agent, or Firm—Helfgott & Karas, P.C.

(57) ABSTRACT

A variable gain amplifier circuit enables the minimum gain to be established easily without changing DC voltage of output terminal at the time when the gain is to be variable. The variable gain amplifier circuit is provided with an input differential circuit consisting of a first and a second transistors whose respective bases are connected to input terminals, and whose respective emitters are connected to constant-current source, and a gain control differential circuit consisting of a third to an eighth transistors 9, 14, 10, 11, 12, and 13 which are connected mutually such that base, collector, and emitter become required relationship. Further, the variable gain amplifier circuit is provided with a first load resistor connected between collector of the third, fifth, and seventh transistors 9, 10, and 12, and a first power supply terminal, and a second load resistor connected between collector of the sixth, eighth, and fourth transistors 11, 13, and 14.

2 Claims, 5 Drawing Sheets

F I G. 4
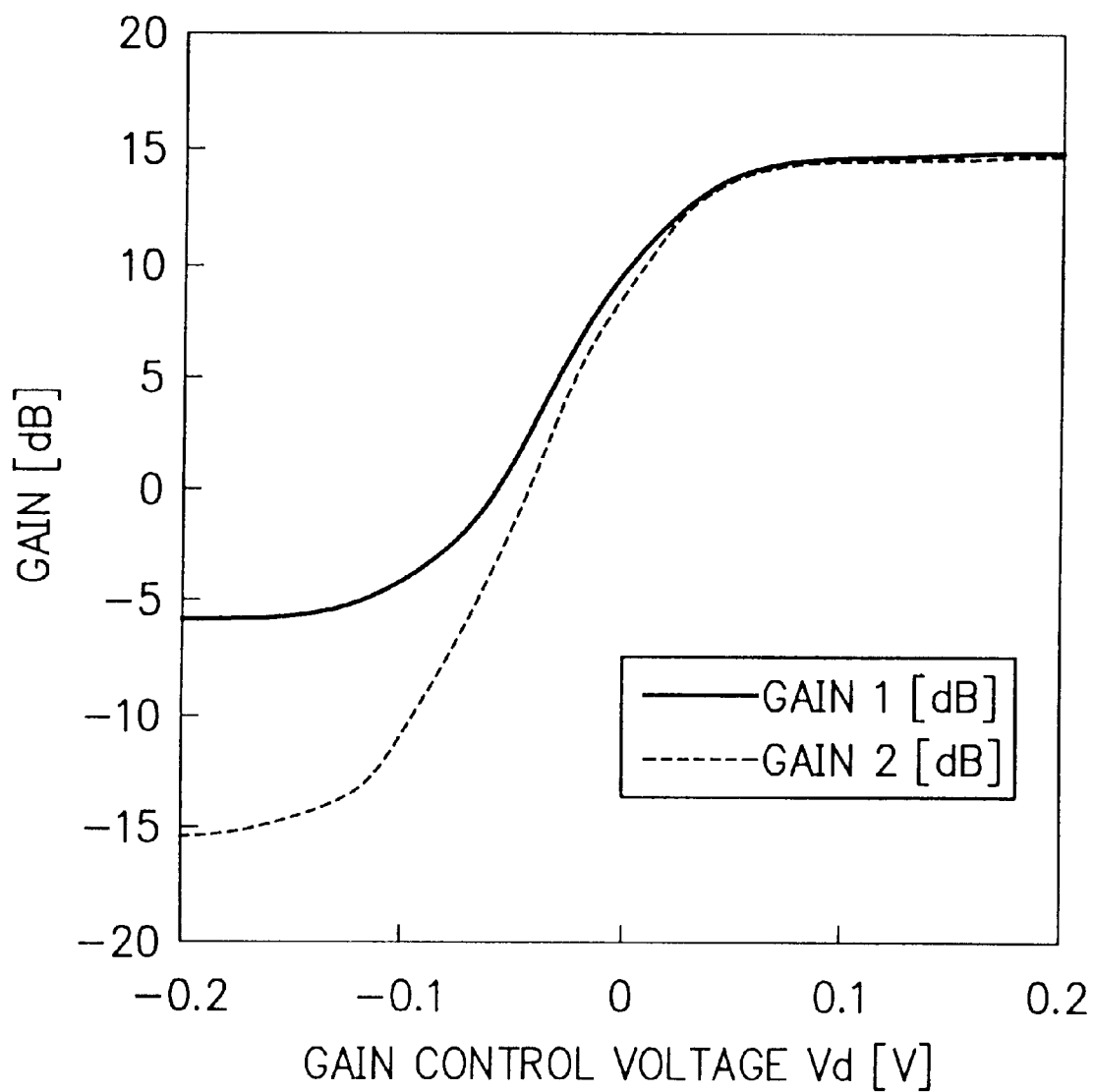

VARIABLE GAIN AMPLIFIER CIRCUIT

BACKGROUND OF THE INVENTION

The present invention relates to a variable gain amplifier circuit. More to particularly, this invention relates to a variable gain amplifier circuit which is capable of implementing establishment of minimum gain without changing of DC voltage of output terminal at the time when the gain is to be variable.

DESCRIPTION OF THE PRIOR ART

In the variable gain amplifier circuit, when the amplifier circuit causes the gain to be changed from the minimum value to the maximum value, it is suitable that there is no change on the DC voltage of the output terminal. In the conventional variable gain amplifier circuit, there was the problem that when the amplifier circuit causes the gain to be changed in answer to the gain control signal, the DC voltage of the output terminal is changed in proportion to the gain. The Japanese Patent Application Laid-Open No. HEI 3-153133 discloses a variable gain amplifier circuit which copes with this problem.

FIG. 1 is a circuit view showing the variable gain amplifier circuit according to the conventional example disclosed in the Japanese Patent Application Laid-Open No. HEI 3-153113. The variable gain amplifier circuit shown in FIG. 1 is provided with the input differential circuit, the gain control differential circuit, and the first and the second load resistors. The variable gain amplifier circuit is connected between the first power supply terminal 52 and the first and the second constant-current sources 37, 38, thus differential amplifying an input signal inputted to the first and the second input terminals 33, 34 to be outputted in accordance with the gain control signal from the first and the second gain control terminals 31, 32.

The input differential circuit is provided with the first transistor 35 whose base is connected to the input terminal 33, and the second transistor 36 whose base is connected to the input terminal 34. Each emitter of the first transistor 35 and the second transistor 36 is connected to each other through the first emitter feedback resistor 41, and is connected to the first and the second constant-current sources 37, 38. Numerals 39, 40 denote earth terminals.

The gain control differential circuit is provided with the third, ninth, tenth, and fourth transistors 42, 43, 48, and 49 whose respective bases are connected to the first gain control terminal 31, and whose respective collectors are connected to the first and the second output terminals 53 and 54 and the fifth, sixth, seventh, and eighth transistors 44, 45, 46, and 47 whose respective bases are connected to the second gain control terminal 32. The respective emitters of the third, ninth, fifth, and sixth transistors 42, 43, 44, and 45 are connected commonly to the collector of the first transistor 35. The respective emitters of the seventh, eighth, tenth, and fourth transistors 46, 47, 48, and 49 are connected commonly to the collector of the second transistor 36. The respective collectors of the fifth and the seventh transistors 44, and 46 are connected commonly to the first output terminal 53. The respective collectors of the sixth and the eighth transistors 45 and 47 are connected commonly to the second output terminal 154. The first load resistor 50 is connected between the respective collectors of the third, ninth, fifth, and seventh transistors 42, 43, 44, and 46 and the first power supply terminal 52. The second load resistor 51 is connected between respective collectors of the sixth, eighth, tenth, and fourth transistors 45, 47, 48, and 49 and the first power supply terminal 52.

Furthermore, there is equally established mutually the area of emitter region of the third, ninth, fifth, sixth, seventh, eighth, tenth, and fourth transistors 42, 43, 44, 45, 46, 47, 48, and 49.

The conventional variable gain amplifier circuit shown in FIG. 1 operates as follows: Namely, signals inputted from the first and the second input terminal 33, 34 are converted into current by the first and the second transistors 35, 36, thus being inputted commonly to the respective emitters of the third, ninth, fifth, and sixth transistors 42, 43, 44, and 45, and the seventh, eighth, tenth, and fourth transistors 46, 47, 48, and 49. The currents inputted to the respective emitters are shared among respective collectors of the third, ninth, fifth, and sixth transistors 42, 43, 44, and 45, and respective collectors of the seventh, eighth, tenth, and fourth transistors 46, 47, 48, and 49 in accordance with the gain control voltage Vd from the gain control terminals 31 and 32. The DC components of the collector current of the third, ninth, fifth, sixth, seventh, eighth, tenth, and fourth transistors 42, 43, 44, 45, 46, 47, 48, and 49 are taken to be $I_{CQ3}$, $I_{CQ9}$, $I_{CQ5}$, $I_{CQ6}$, $I_{CQ7}$, $I_{CQ8}$, $I_{CQ10}$, and $I_{CQ4}$ respectively, and the DC components of the collector current of the first and the second transistors 35 and 36 are taken to be Io. There is obtained following formulas:

$$I_{CQ3} = I_{CQ9} = I_{CQ10} = I_{CQ4} = \frac{Io}{2\left(1 + e^{-\frac{Vd}{VT}}\right)}$$

$$I_{CQ5} = I_{CQ6} = I_{CQ7} = I_{CQ8} = \frac{Io}{2\left(1 + e^{\frac{Vd}{VT}}\right)}$$

Consequently, the DC current flowing through the first and the second load resistances 50, and 51 becomes $$I_{CQ3}+I_{CQ9}+I_{CQ5}+I_{CQ7}=I_{CQ4}+I_{CQ10}+I_{CQ8}+I_{CQ6}=Io$$

thus becoming constant, without depending on the gain control voltage Vd. Namely, when the gain to be variable, there is no change on the DC voltage of the output terminal.

Furthermore, the AC components of the collector current of the third, ninth, fifth, sixth, seventh, eighth, tenth, and fourth transistors 42, 43, 44, 45, 46, 47, 48, and 49 are taken to be $i_{CQ3}$, $i_{CQ9}$, $i_{CQ5}$, $i_{CQ6}$, $i_{CQ7}$, $i_{CQ8}$, $i_{CQ10}$, and $i_{CQ4}$, and the AC component of the collector current of the first transistor 35 is taken to be io, there is obtained following formulas:

$$i_{CQ3} = i_{CQ9} = \frac{io}{2\left(1 + e^{-\frac{Vd}{VT}}\right)} = -i_{CQ10} = -i_{CQ4}$$

$$i_{CQ5} = i_{CQ6} = \frac{io}{2\left(1 + e^{\frac{Vd}{VT}}\right)} = -i_{CQ7} = -i_{CQ8}$$

Consequently, the AC current flowing through the first and the second load resistors 50 and 51 becomes $$i_{CQ3} + i_{CQ9} + i_{CQ5} + i_{CQ7} = \frac{io}{1 + e^{-\frac{Vd}{VT}}}$$

$$i_{CQ4} + i_{CQ10} + i_{CQ8} + i_{CQ6} = -\frac{io}{1 + e^{-\frac{Vd}{VT}}}$$

Namely, the AC component of the collector current of the fifth and seventh transistors 44 and 46, and the AC component of the collector current of the eighth and sixth transistors 47 and 45 are canceled completely with each other, thereby not contributing to the gain.

Next, there is taken with the load resistor as Rc, with the gain control voltage (gain control signal) as Vd, with the transfer conductance of the input differential circuit as Gm, with the thermal voltage as VT. At this time, the gain G of the variable gain amplifier circuit becomes $$G = 20\log(GmRc) - 20\log\left(1 + e^{-\frac{Vd}{VT}}\right)$$

Here, when the gain control voltage increases in the negative direction, the minimum gain Gmin becomes $$Gmin = -\infty$$

However, in the conventional variable gain amplifier circuit shown in FIG. 1, there is the problem that when the gain control voltage which is applied to the gain control terminal at the time when the gain is to be variable exceeds the regular range in the negative direction, thus the gain falls to the negative infinity.

The reason why there is obtained sum of the collector current of the fifth and the seventh transistors 44 and 46 or the collector current of the sixth and the eighth transistors 45 and 47 whose amplitude of AC component equals with each other, and whose phases are different mutually in the 180 degrees out of the fifth, sixth, seventh, and eighth transistors 44, 45, 46, and 47 which operate at the time of minimum gain establishment with the same DC collector current so as not to change the DC voltage of the output terminal, thus the AC component thereof is canceled completely so that the gain falls to the negative infinity.

Furthermore, there is the problem that the gain control circuit becomes complicated in order to overcome the above-described problem, thus rendering the pellet size large.

The reason why it becomes necessary to newly prepare a circuit for adding limitation such that the gain control voltage does not exceed the regular range in the negative direction for obtaining required minimum gain.

There are prior art references similar to the above described variable gain amplifier circuit shown in FIG. 1.

A. The Japanese Patent Application Laid-Open No. HEI 5-259768 discloses a variable gain amplifier in which the operating point of the output voltage does not fluctuate.

B. The Japanese Patent Application Laid-Open No. SHO 62-183207 discloses a variable gain amplifier in which fluctuation taken place essentially of output DC level is eliminated completely.

C. The Japanese Patent Application Laid-Open No. SHO 58-200612 discloses a variable gain amplifier in which component of DC fluctuation does not appear.

D. The Japanese Patent Application Laid-Open No. HEI 10-41750 which discloses "GAIN CONTROL FREQUENCY CONVERSION CIRCUIT.

In the above-described references A, B, and C, a pair of gain control differential transistors is provided. For instance, Q7 and Q8 of FIG. 3 of A, elements 4 and 5 of FIG. 1 of B, and Q14 and Q15 of FIG. 2 of C. In the whole respective cases, these gain control differential transistors are the same transistors completely with each other. Namely, in these configurations of A, B, and C, there is not obtained any effect with the exception that the variable gain amplifier circuit does not vary the DC voltage of the output terminal.

SUMMARY OF THE INVENTION

In view of the foregoing, it is an object of the present invention for resolving the above-mentioned problems to provide a variable gain amplifier circuit which enables the minimum gain to be established easily without changing the DC voltage of the output terminal at the time when the gain is to be variable.

According to a first aspect of the present invention for overcoming the above-mentioned problems to provide a variable gain amplifier circuit provided with an input differential circuit, a gain control differential circuit, a first load resistor, and a second load resistor, while being connected between a first power supply terminal and a first constant-current source, thus differential amplifying to be outputted a first and a second input signals in accordance with a gain control signal from a first and a second gain control terminals characterized in that the input differential circuit provided with a first transistor whose base is connected to a first input terminal, and a second transistor whose base is connected to a second input terminal, in which respective emitters of the first and the second transistors are connected commonly to the first constant-current source the gain control differential circuit provided with a third and a fourth transistors whose respective bases are connected to the first gain control terminal and whose respective collectors are connected to a first and a second output terminals, and a fifth, a sixth, a seventh, and a eighth transistors whose respective bases are connected commonly to the second gain control terminal, in which respective emitters of the third, fifth, and sixth transistors are connected commonly to collector of the first transistor, and respective emitters of the seventh, eighth, and fourth transistors are connected commonly to collector of the second transistor, and respective collectors of the fifth and seventh transistors are connected commonly to the first output terminal, and respective collectors of the sixth and eighth transistors are connected commonly to the second output terminal, the first load resistor is connected between the collector of the third, fifth, and seventh transistors and the first power supply terminal, and the second load resistor is connected between the collector of the sixth, eighth, and fourth transistors and the first power supply terminal. Respective areas of emitter region among the third and fourth transistors, the fifth and eighth transistors, and the sixth and seventh transistors are equally established mutually. Area of emitter region of the fifth or eighth transistor is larger than area of emitter region of the sixth or seventh transistor.

According to a second aspect of the present invention, there is provided a variable gain amplifier circuit, wherein there is connected a first emitter feedback resistor between the first transistor and the first constant-current source, and a second emitter feedback resistor between the second transistor and said first constant-current source.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 4 is a characteristic view showing the change of the gain when there is changed the gain control voltage in the variable gain amplifier circuit according to the embodiment 1 of the present invention;

DETAILED DESCRIPTION OF THE PREFERRED EMBODIMENTS

A preferred embodiment of the present invention will be described in detail in accordance with the accompanying drawings.

[Embodiment 1]

Figure 1:
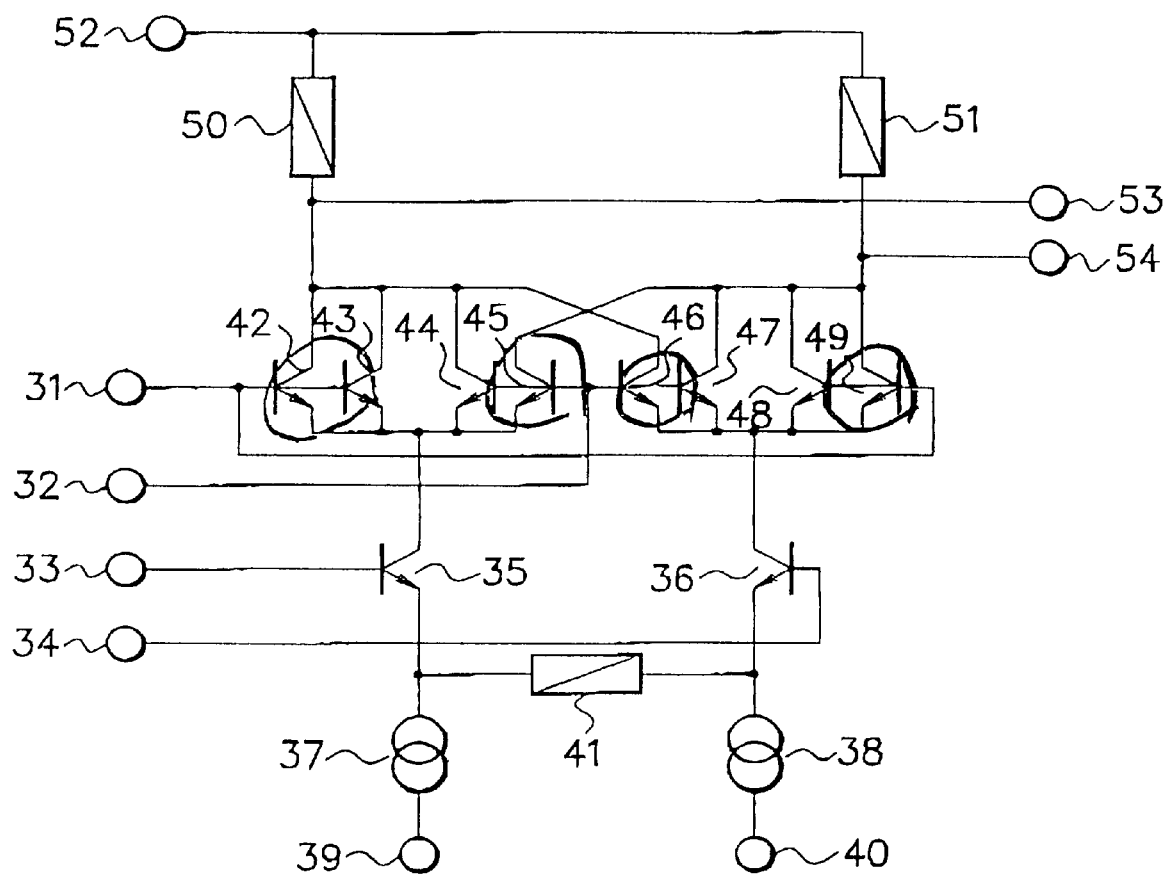
FIG. 1 is a circuit view showing a conventional variable gain amplifier circuit.
Figure 2:
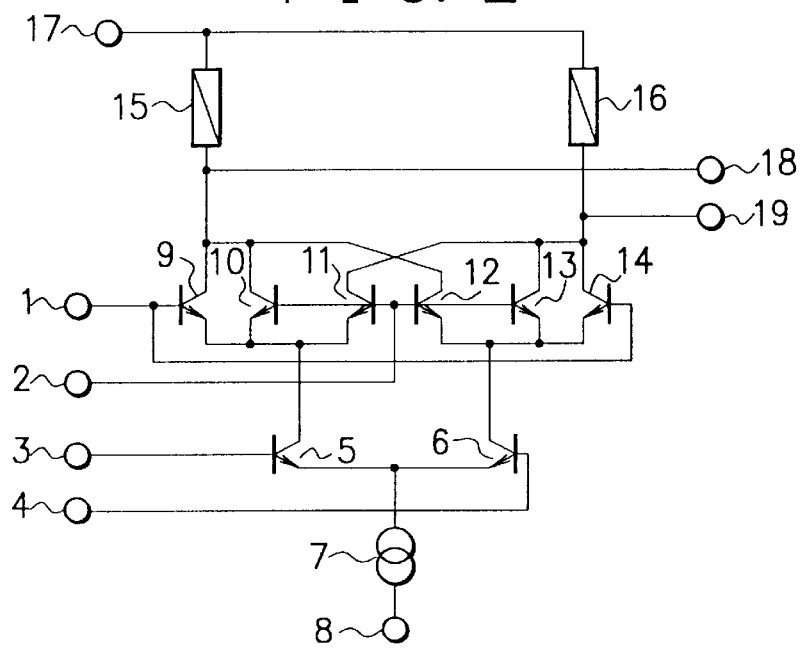
FIG. 2 is a circuit view showing a variable gain amplifier circuit according to an embodiment 1 of the present invention.

FIG. 2 is a circuit view showing a variable gain amplifier circuit according to an embodiment 1 of the present invention.

In FIG. 2, the variable gain amplifier circuit according to the embodiment 1 of the present invention is provided with an input differential circuit, a gain control differential circuit, a first load resistor, and a second load resistor, which variable gain amplifier circuit is connected between a first power supply terminal 17 and a first constant-current source 7, thus differential amplifying the input signal to be outputted from the first and the second input terminals 3 and 4 in accordance with a gain control signal from gain control terminals 1 and 2.

The input differential circuit is provided with a first transistor 5 whose base is connected to the first input terminal 3, and a second transistor 6 whose base is connected to the second input terminal 4. Respective emitters of the first and the second transistors 5 and 6 are connected commonly to the first constant-current source 7.

The gain control differential circuit is provided with a third and a fourth transistors 9 and 14 whose respective bases are connected to a first gain control terminal 1, and whose respective collectors are connected to a first and a second output terminals 18 and 19, and a fifth, sixth, seventh, and eighth transistors 10, 11, 12, and 13 whose respective bases are connected commonly to a second gain control terminal 12. The third, fifth, and sixth transistors 9, 10, and 11 are connected commonly to a collector of the first transistor 5, and the seventh, eighth, and fourth transistors 12, 13, and 14 are connected commonly to a collector of the second transistor 6. Further, the respective collectors of the fifth and the seventh transistors 10 and 12 are connected commonly to the first output terminal 18, and the respective collectors of the sixth and the eighth transistors 11 and 13 are connected commonly to the second output terminal 19.

Furthermore, the first load resistor 15 is connected between the collector of the third, fifth, and seventh transistors 9, 10, and 12 connected commonly thereto and the first power supply terminal 17. Moreover, the second load resistor 16 is connected between the collector of the sixth, eighth, and fourth transistors 11, 13, and 14 connected commonly thereto and the first power supply terminal 17.

Furthermore, an area of the emitter region of the third transistor 9 equals mutually to an area of the emitter region of the fourth transistor 14. An area of the emitter region of the fifth transistor 10 equals mutually to an area of the emitter region of the eighth transistor 13. An area of the emitter region of the sixth transistor 11 equals mutually to an area of the emitter region of the seventh transistor 12. An area of emitter region of the fifth or the eighth transistor 10, or 13 is larger than an area of emitter region of the sixth or seventh transistor 11, or 12.

In the variable gain amplifier circuit according to the embodiment 1 of the present invention shown in FIG. 2, the signals inputted from the input terminals 3 and 4 are converted into respective currents by means of the first and the second transistors 5 and 6. The current is inputted commonly to the respective emitters of the third, fifth, and sixth transistors 9, 10, and 11 from the first transistor 5, further the current is inputted commonly to the respective emitters of the seventh, eighth, and fourth transistors 12, 13, and 14 from the second transistor 6. Furthermore, the current is shared among respective collectors of the transistors in accordance with the gain control voltage Vd from the gain control terminals 1 and 2, thus being outputted from the output terminals 18 and 19 while being converted into voltage by means of the load resistors 15 and 16.

There is set an area ratio of emitter region of the third transistor 9 or the fourth transistor 14, the fifth transistor 10 or the eighth transistor 13, and the sixth transistor 11 or the seventh transistor 12 to be l:m:n, further there is set the DC component of the collector current to be $I_{CQ3}$, $I_{CQ5}$, $I_{CQ6}$, $I_{CQ7}$, $I_{CQ8}$, and $I_{CQ4}$, furthermore, there is set the DC component of the collector current of the first and the second transistors 5 and 6 to be Io, thus resulting in $$I_{CQ5} = I_{CQ8} = \frac{I_0 m e^{-\frac{Vd}{Vr}}}{l\left(1 + \frac{m+n}{l}e^{-\frac{Vd}{Vr}}\right)}$$

$$I_{CQ6} = I_{CQ7} = \frac{I_0 m e^{-\frac{Vd}{Vr}}}{l\left(1 + \frac{m+n}{l}e^{-\frac{Vd}{Vr}}\right)}$$

$$I_{CQ6} = I_{CQ7} = \frac{I_0 m e^{-\frac{Vd}{Vr}}}{l\left(1 + \frac{m+n}{l}\right)e^{-\frac{Vd}{Vr}}}$$

Here, l=m+n (this is an assumption, and there is set by way of one example for simplified calculation) and m>n (this is indispensable).

Consequently, the DC current flowing through the first and the second load resistors 15 and 16 becomes $$I_{CQ3}+I_{CQ5}+I_{CQ7}=I_{CQ4}+I_{CQ8}+I_{CQ6}=Io$$

which is constant without depending on the gain control voltage Vd.

Namely, the DC voltage of the output terminal does not change at the time when the gain is to be variable.

There is set AC component of respective collector current of the third, fifth, sixth, seventh, eighth, and fourth transistors 9, 10, 11, 12, 13, and 14 to be $i_{CQ3}$, $i_{CQ5}$, $i_{CQ6}$, $i_{CQ7}$, $i_{CQ8}$, and $i_{CQ4}$, and there is set the AC component of the collector current of the first transistor 5 to be io, resulting in $$i_{CQ3} = \frac{io}{1+e^{-\frac{Vd}{VT}}} = -i_{CQ4}$$

-continued $$i_{CQ5} = \frac{iome^{-\frac{Vd}{VT}}}{l\left(1+e^{-\frac{Vd}{VT}}\right)} = -i_{CQ8}$$

$$i_{CQ6} = \frac{ione^{-\frac{Vd}{VT}}}{l\left(1+e^{-\frac{Vd}{VT}}\right)} = -i_{CQ7}$$

Consequently, the AC current flowing through the first and the second load resistors 15 and 16 becomes $$i_{CQ3} + i_{CQ5} + i_{CQ7} = \frac{io\left(1+\frac{m-n}{l}e^{-\frac{Vd}{VT}}\right)}{1+e^{-\frac{Vd}{VT}}}$$

$$i_{CQ4} + i_{CQ8} + i_{CQ6} = -\frac{io\left(1+\frac{m-n}{l}e^{-\frac{Vd}{VT}}\right)}{1+e^{-\frac{Vd}{VT}}}$$

Namely, the AC component of the fifth and seventh transistors 10, and 12, and the eighth and the sixth transistors 13, and 11 are not completely canceled respectively, therefore, contributing to the minimum gain.

$$G = 20\log(GmRc) - 20\log\left(\frac{1+e^{-\frac{Vd}{VT}}}{1+\frac{m-n}{l}e^{-\frac{Vd}{VT}}}\right)$$

There is set with the load resistor as Rc, with the gain control voltage (gain control signal) as Vd, with the transfer conductance of the input differetial circuit as Gm, and with the thermal voltage as VT. At this time, the gain G of the variable gain amplifier circuit result in the above formula.

Here, when the gain control voltage Vd increase in the negative direction, the minimum gain Gmin results in $$Gmin = 20\log(gmRc) - 20\log\left(\frac{l}{m-n}\right)$$

The minimum gain Gmin is determined by only the area-ratio of emitter region l:m:n of the third transistor 9 (or the fourth transistor 14), the fifth transistor 10 (or the eighth transistor 13), and the sixth transistor 11 (or the seventh transistor 12). Consequently, since it is unnecessary to restrict the minimum gain in accordance with the gain control signal, it becomes possible to simplify the gain control section.

Figure 3:
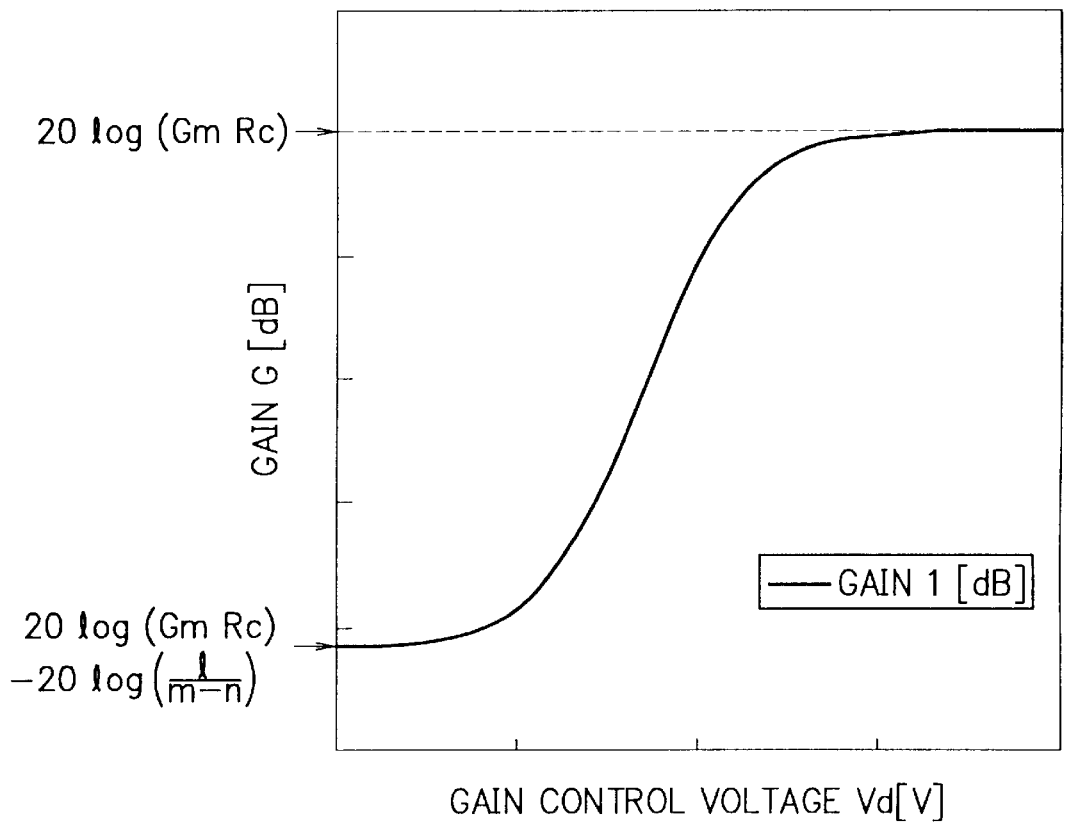
FIG. 3 is a characteristic view showing the change of the gain when there is changed the gain control voltage in the variable gain amplifier circuit according to the embodiment 1 of the present invention.

FIG. 3 is a characteristic view showing change of the gain when there is changed the gain control voltage Vd in the variable gain amplifier circuit according to the embodiment 1 of the present invention shown in FIG. 2.

As it becomes clear from FIG. 3, when there is changed the gain control voltage Vd, it is known that the gain changes from the minimum gain $20\log(GmRc)-20\log\{1/(m-n)\}$ to the maximum gain $20\log(GmRc)$.

FIG. 4 is a characteristic view showing change of the gain when there is changed the gain control voltage Vd in the variable gain amplifier circuit according to the embodiment 1 of the present invention.

In FIG. 4, the maximum gain $20\log(GmRc)$ is taken to be 15[dB].

In the embodiment 1 of the present invention, the input differential circuit consisting of the first and the second transistors 5 and 6 is provided with the transfer conductance Gm. There is set the area-ratio of emitter region of the third transistor 9 (or the fourth transistor 14), the fifth transistor 10 (or the eighth transistor 13), and the sixth transistor 11(or the seventh transistor 12) to be 11:6:5.

At this case, the gain in the embodiment 1 of the present invention changes as the gain 1 shown by solid line of FIG. 4.

Further, in the embodiment 1 of the present invention, the input differential circuit consisting of the first and the second transistors 5 and 6 is provided with the transfer conductance Gm, and there is set the area-ratio of emitter region of the third transistor 9 (or the fourth transistor 14), the fifth transistor 10 (or the eighth transistor 13), and the sixth transistor 11 (or the seventh transistor 12) to be 33:17:16.

At this case, the gain in the embodiment 1 of the present invention changes as the gain 2 shown by dotted line of FIG. 4.

[Embodiment 2]

Figure 5:
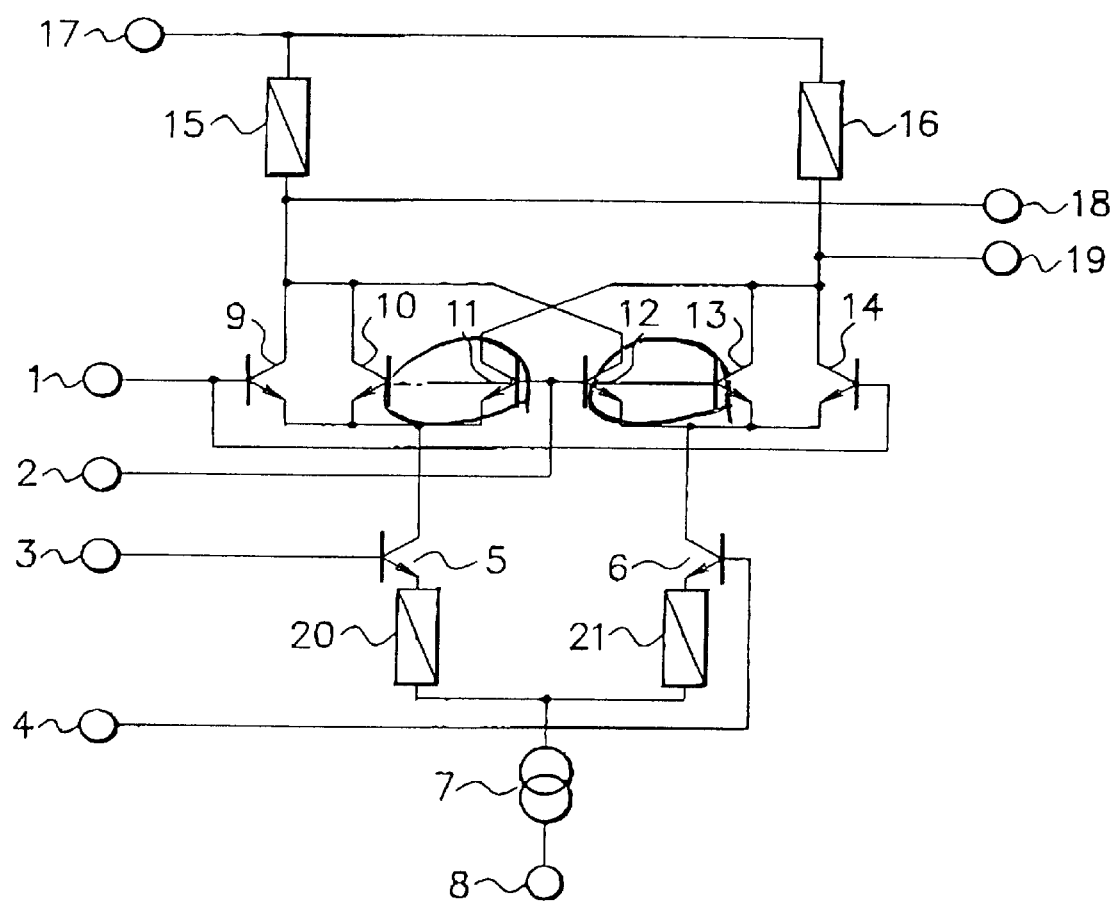
FIG. 5 is a circuit view showing a variable gain amplifier circuit according to an embodiment 2 of the present invention.

FIG. 5 is a circuit view showing a variable gain amplifier circuit according to an embodiment 2 of the present invention.

The variable gain amplifier circuit according to the embodiment 2 of the present invention shown in FIG. 5 is characterized in that there is connected the first and the second emitter feedback resistors 20 and 21 between the first transistor 5 in the embodiment 1 shown in FIG. 2 and the constant-current source 7 and between the second transistor 6 and the first constant-current source 7. The rest of the constitution is the same as that of the embodiment 1.

In the embodiment 2 of the present invention, there is set Gm≈1/(2RE) while taking the transfer conductance of the input differential circuit consisting of the first and the second transistors 5, and 6, and the first and the second emitter feedback resistors 20 and 21 to be Gm, and while taking respective resistance values of the first and the second emitter feedback resistors to be RE.

At this time, G of the variable gain amplifier circuit results in $$G = 20\log\left(\frac{Rc}{2RE}\right) - 20\log\left(\frac{1+e^{-\frac{Vd}{VT}}}{1+\frac{m-n}{l}e^{-\frac{Vd}{VT}}}\right)$$

Here, when the gain control voltage Vd increases in the negative direction, the minimum gain Gmin results in $$Gmin = 20\log\left(\frac{Rc}{2RE}\right) - 20\log\left(\frac{l}{m-n}\right)$$

In the embodiment 2 of the present invention, when there is set the current of the first constant-current source 7 to be 2Io, there is spread input dynamic range of the input differential circuit by 2Io×RE, on the ground that the emitter feedback resistors 20, 21. For this reason, even though the amplitude of the input signal from the input terminal 3, and 4 is large, distortion characteristic does not deteriorate.

Figure 6:
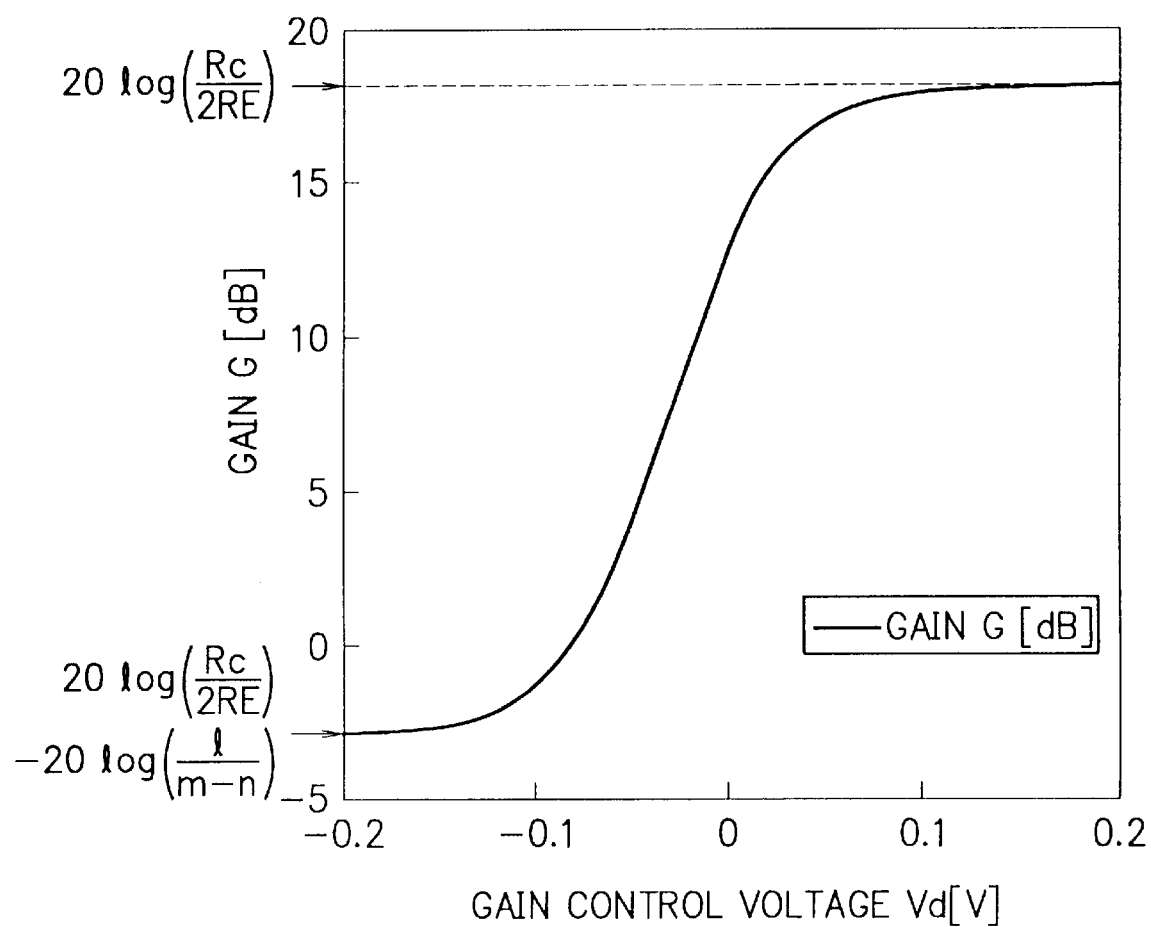
FIG. 6 is a characteristic view showing the change of the gain when there is changed the gain control voltage in the variable gain amplifier circuit according to the embodiment 2 of the present invention.

FIG. 6 is a characteristic view showing change of the gain when there is changed the gain control voltage Vd in the variable gain amplifier circuit according to the embodiment 2 of the present invention.

It becomes clear from FIG. 6, when there is changed the gain control voltage Vd, it is known that there is changed the gain from the minimum gain $20\log(Rc/2RE)-20\log\{1/(m-n)\}$ to the maximum gain $20\log(Rc/2RE)$ therebetween.

There is described the present invention based on the preferred embodiment. The variable gain amplifier circuit of the present invention is not limited by only the constitution of the above embodiments. There is included variable gain amplifier circuit which is changed and modified from the constitution of the above embodiment in the present invention.

As described above, according to the present invention, there can be provided the variable gain amplifier circuit whose DC voltage of the output terminal is not changed, even though it causes the gain to be changed in accordance with the gain control voltage.

Further, it is capable of establishing the minimum gain easily through the area-ratio of emitter region of the transistor of the gain control differential circuit.

Furthermore, since it is possible to establish the minimum gain easily by only relative ratio of the elements, the gain control voltage generation circuit becomes simple constitution.

While preferred embodiments of the invention have been described using specific terms, such description is for illustrative purpose only, and it is to be understood that changes and variations may be made without departing from the spirit or scope of the following claims.

What is claimed is:

1. A variable gain amplifier circuit provided with an input differential circuit, a gain control differential circuit, a first load resistor, and a second load resistor, while being connected between a first power supply terminal and a first constant-current source, thus differential amplifying to be outputted a first and a second input signals in accordance with a gain control signal from a first and a second gain control terminals characterized in that:

said input differential circuit provided with a first transistor whose base is connected to a first input terminal, and a second transistor whose base is connected to a second input terminal, in which respective emitters of said first and said second transistors are connected commonly to said first constant-current source;

said gain control differential circuit provided with a third and a fourth transistors whose respective bases are connected to said first gain control terminal and whose respective collectors are connected to a first and a second output terminals, and a fifth, a sixth, a seventh, and a eighth transistors whose respective bases are connected commonly to said second gain control terminal, in which respective emitters of said third, fifth, and sixth transistors are connected commonly to collector of said first transistor, and respective emitters of said seventh, eighth, and fourth transistors are connected commonly to collector of said second transistor, and respective collectors of said fifth and seventh transistors are connected commonly to said first output terminal, and respective collectors of said sixth and eighth transistors are connected commonly to said second output terminal;

said first load resistor is connected between said collector of said third, fifth, and seventh transistors and said first power supply terminal;

said second load resistor is connected between said collector of said sixth, eighth, and fourth transistors and said first power supply terminals;

respective areas of emitter region among said third and fourth transistors, said fifth and eighth transistors, and said sixth and seventh transistors are equally established mutually; and area of emitter region of said fifth or eighth transistor is larger than area of emitter region of said sixth or seventh transistor;

wherein the area of emitter region of the third transistor is equal to the sum of the areas of the emitter regions of the fifth and sixth transistors, and the area of the emitter region of the fourth transistor is equal to the sum of the areas of the emitter regions of the seventh and eighth transistors.

2. A variable gain amplifier circuit as claimed in claim 1, wherein there is connected a first emitter feedback resistor between said first transistor and said first constant-current source, and a second emitter feedback resistor between said second transistor and said first constant-current source.

* * * * *